United States Patent
Cao et al.

(10) Patent No.: US 10,192,893 B2
(45) Date of Patent: Jan. 29, 2019

(54) ARRAY SUBSTRATE AND DISPLAY DEVICE

(71) Applicant: BOE TECHNOLOGY GROUP CO., LTD., Beijing (CN)

(72) Inventors: Zhanfeng Cao, Beijing (CN); Feng Zhang, Beijing (CN); Qi Yao, Beijing (CN); Jincheng Gao, Beijing (CN); Bin Zhang, Beijing (CN); Xiaolong He, Beijing (CN); Zhengliang Li, Beijing (CN); Wei Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 14/895,352

(22) PCT Filed: May 15, 2015

(86) PCT No.: PCT/CN2015/079126
§ 371 (c)(1),
(2) Date: Dec. 2, 2015

(87) PCT Pub. No.: WO2016/110036
PCT Pub. Date: Jul. 14, 2016

(65) Prior Publication Data
US 2016/0351585 A1    Dec. 1, 2016

(30) Foreign Application Priority Data
Jan. 9, 2015 (CN) .......................... 2015 1 0012613

(51) Int. Cl.
*H01L 27/12* (2006.01)
*G02F 1/1362* (2006.01)
*G02F 1/1345* (2006.01)

(52) U.S. Cl.
CPC .......... *H01L 27/124* (2013.01); *G02F 1/1345* (2013.01); *G02F 1/13452* (2013.01);
(Continued)

(58) Field of Classification Search
CPC ........... G02F 1/136204; G02F 1/13452; G02F 1/1345; G02F 1/13454; H01L 27/124;
(Continued)

(56) References Cited

U.S. PATENT DOCUMENTS

| 8,173,498 B2 | 5/2012 | Lin et al. |
| 2005/0146649 A1* | 7/2005 | Sato .................. G02F 1/136209 349/44 |

(Continued)

FOREIGN PATENT DOCUMENTS

| CN | 201828742 U | 5/2011 |
| CN | 102393587 A * | 3/2012 |

(Continued)

OTHER PUBLICATIONS

International Search Report of PCT/CN2015/079126 in Chinese, dated Oct. 12, 2015 with English translation.

(Continued)

*Primary Examiner* — Cuong Q Nguyen
(74) *Attorney, Agent, or Firm* — Collard & Roe, P.C.

(57) ABSTRACT

An array substrate and a display device are provided. The array substrate comprises a plurality of signal lines (40), a plurality of connecting lines (50) and a driving module (60) in a peripheral region (1) outside a display region (2); the connecting lines (50) are configured for connecting the signal lines (40) and the driving module (60), to transmit signal from the signal lines (40) to the driving module (60), wherein, at least one of the connecting lines (50) and at least one of the signal lines (40) are designed to intersect with and insulated from each other in a first region (N). The at least one of the signal lines (40) includes, in a second region (0) other than the first region (N), a first electrode line layer (401) and a second electrode line layer (402), while, in the first region (N), includes the first electrode line layer (401)

(Continued)

but does not include the second electrode line layer (402). The array substrate may prevent problems of electrostatic accumulation or short circuit from occurring between the connecting lines (50) and the second electrode line layer (402).

17 Claims, 7 Drawing Sheets

(52) U.S. Cl.
CPC ........ *G02F 1/136204* (2013.01); *H01L 27/12* (2013.01); *G02F 1/13454* (2013.01)

(58) Field of Classification Search
CPC . H01L 27/12; H01L 27/1222; H01L 27/1225; H01L 27/1248; H01L 27/126; H01L 27/127
See application file for complete search history.

(56) References Cited

U.S. PATENT DOCUMENTS

2008/0055212 A1 3/2008 Kim
2010/0079443 A1* 4/2010 Chang .................. G09G 3/3677 345/214
2015/0301415 A1* 10/2015 Sawada .................. G11C 19/28 349/147

FOREIGN PATENT DOCUMENTS

| CN | 104617106 A | 5/2012 |
| TW | 201042345 A | 12/2010 |
| WO | 2014/069279 A1 | 5/2014 |

OTHER PUBLICATIONS

Notice of Transmittal of the International Search Report of PCT/CN2015/079126 in Chinese, dated Oct. 12, 2015.

Written Opinion of the International Searching Authority of PCT/CN2015/079126 in Chinese, dated Oct. 12, 2015 with English translation.

Chinese Office Action in Chinese Application No. 201510012613.1, dated Mar. 20, 2017 with English translation.

\* cited by examiner

US 10,192,893 B2

ARRAY SUBSTRATE AND DISPLAY DEVICE

CROSS REFERENCE TO RELATED APPLICATIONS

This application is the National Stage of PCT/CN2015/079126 filed on May 15, 2015, which claims priority under 35 U.S.C. § 119 of Chinese Application No. 201510012613.1 filed on Jan. 9, 2015, the disclosure of which is incorporated by reference.

TECHNICAL FIELD

Embodiments of the present disclosure relate to an array substrate and a display device.

BACKGROUND

As users constantly pursue quality of display, a narrow-frame display device has become a hotspot in business researches. Especially in a mobile phone industry, a narrow-frame mobile phone has bigger screen, lighter weight than other mobile phones of a same size, and has become a hotspot of consumption.

At present, a narrow-frame technology mainly implemented by a Gate Driver on Array (GOA) technology. The conventional gate driving circuit of thin film transistor is mainly formed by sticking an Integrated Circuit (IC) outside a liquid crystal panel; however, the GOA technology is to directly integrate a gate driving circuit of a thin film transistor onto an array substrate, so that it is not necessary to separately form the gate driving circuit, avoiding sticking the gate driving circuit on the liquid crystal panel, thereby reducing a frame of the display panel, simplifying a fabrication process, and reducing production cost at the same time.

SUMMARY

An embodiment of the disclosure provides an array substrate, comprising a plurality of signal lines, a plurality of connecting lines and a driving module in a peripheral region outside a display region, the connecting lines being configured for connecting the signal lines and the driving module, to transmit signal from the signal lines to the driving module, wherein, at least one of the connecting lines and at least one of the signal lines are designed to intersect with and insulated from each other in a first region, the at least one of the signal lines, in a second region other than the first region, includes a first electrode line layer and a second electrode line layer, while, in the first region, includes the first electrode line layer but does not include the second electrode line layer.

An embodiment of the disclosure further provides a display device, comprising the array substrate described above.

BRIEF DESCRIPTION OF THE DRAWINGS

In order to clearly illustrate the technical solution of the embodiments of the disclosure or the technical solution in the prior art, the drawings of the embodiments or the drawings in the prior art will be briefly described in the following; it is obvious that the described drawings are only some embodiments of the disclosure and thus are not limitative to the disclosure. Those ordinary skilled in the art can obtain other drawings based on the drawings, without any inventive work.

DETAILED DESCRIPTION

Figure 1:
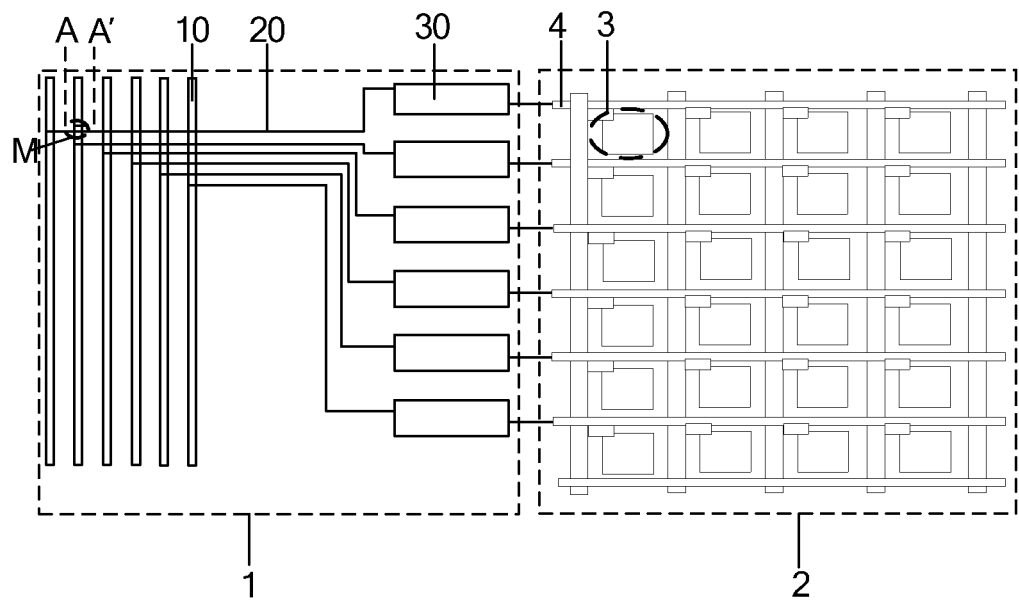
FIG. 1 is a structural schematic diagram of an array substrate provided in a related art.

Hereinafter, the technical solutions of the embodiments of the disclosure will be described in a clearly and fully understandable way in connection with the drawings in the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In the description of the disclosure, it should be noted that, azimuth or positional relationships indicated by terms such as "up", "down" and so on, are based on the azimuth or positional relationships shown in the drawings, which are only to facilitate description of the embodiment of the disclosure and simplify the description, but not to indicate or imply that the device or component must have a specific azimuth, or be constructed or operated in the specific azimuth, which thus should not be understood as a limitation to the disclosure.

Figure 2:
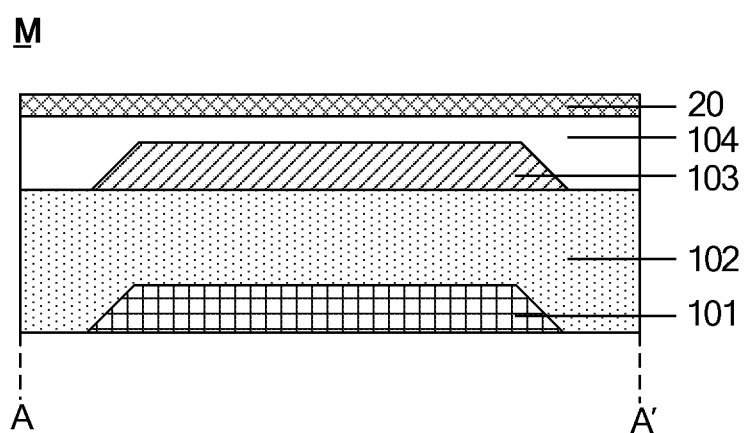
FIG. 2 is a cross-sectional diagram of a region M of FIG. 1 along an AA' direction.

FIG. 1 and FIG. 2 show structural schematic diagrams of an array substrate provided in a related art. As shown in FIG. 1, an array substrate 1 comprises a GOA region 1 and a display region 2, wherein, a plurality of display units 3 are formed in the display region 2, and the GOA region 1 includes a plurality of clock signal lines 10, a plurality of metal connecting lines 20 and a plurality of GOA units 30. Each clock signal line 10 is electrically connected with one GOA unit 30 through one metal connecting line 20, to provide clock signals to the GOA unit 30. The GOA unit 30 is electrically connected with a corresponding gate line 4 in the display region 4, to output a scanning signal to the corresponding gate line 4.

As shown in FIG. 1, in order to electrically connect the metal connecting lines 20 and corresponding clock signal lines 10, some of the metal connecting lines 20 need to cross over other non-corresponding clock signal lines 10 to be electrically connected with the corresponding clock signal lines 10. In order to simplify a fabrication processes, the clock signal line 10 is usually formed together with other layer structures in the display region of the array substrate. As shown in FIG. 2, the clock signal line 10 generally includes a scanning metal line layer 101, an insulating layer 102, a source-drain metal line layer 103 and a passivation layer 104. The inventors have found that an array substrate provided in the related art at least has technical problems as follows: because only the passivation layer 104 which is usually thin (its thickness is in a range of 500 to 2000 Å) is between the source-drain metal line layer 103 and the metal connecting line 20, in an intersecting region between the metal connecting line 20 and a non-corresponding clock signal line 10, electrostatic accumulation or short circuit between the metal connecting line 20 and the source-drain metal line layer 103 of the non-corresponding clock signal line 10 may easily occur, resulting in error in signals input by the metal connecting line 20, thus leading to erroneous clock signals to be received by a GOA unit, and finally causing error in display.

Embodiments of the disclosure provide an array substrate and a display device, which can solve problems of electrostatic accumulation or short circuit between a metal connecting line and a source-drain metal line layer of a non-corresponding clock signal line.

Figure 3:
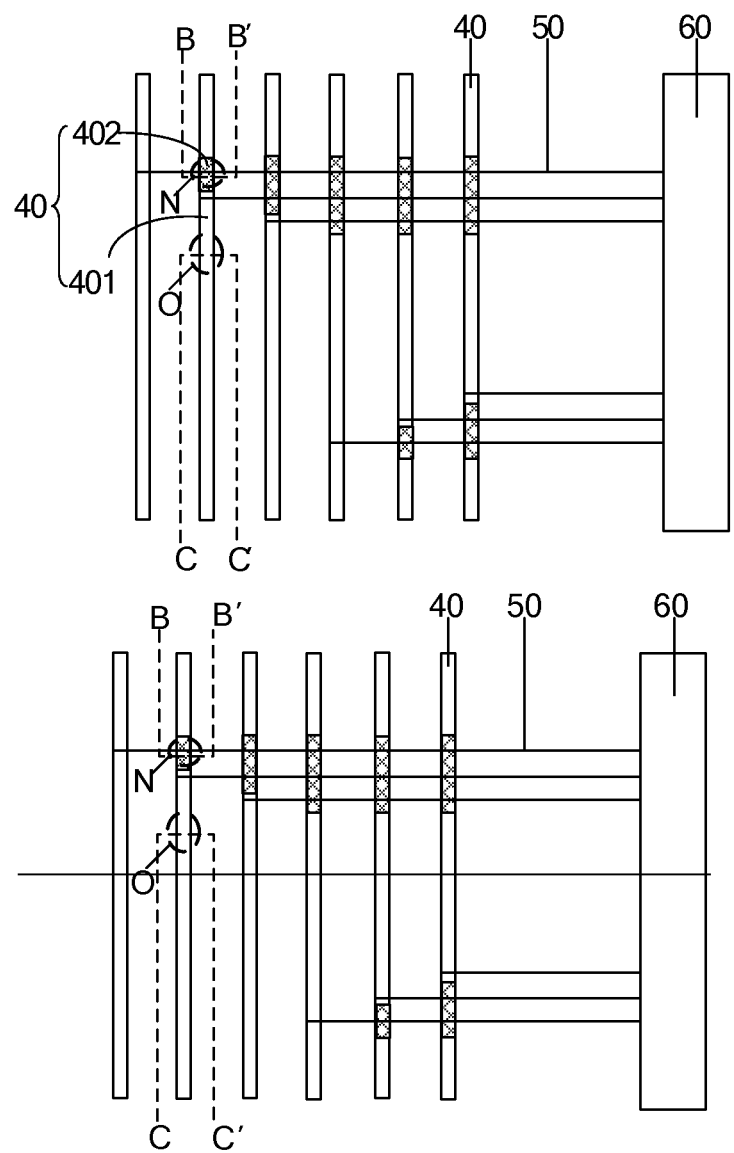
FIG. 3 is a partial planar structural schematic diagram of an array substrate provided by an embodiment of the disclosure.
Figure 4:
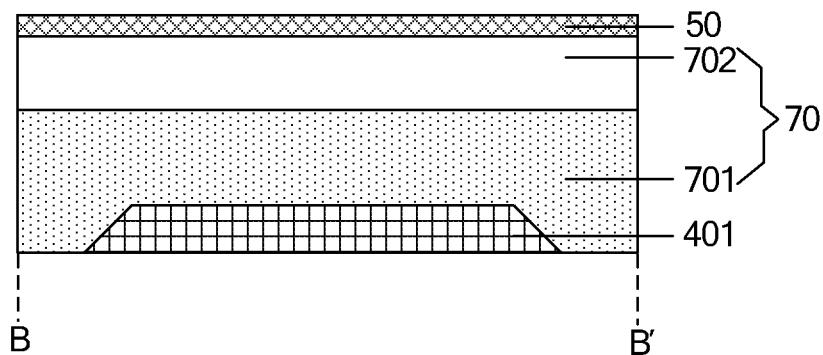
FIG. 4 is a cross-sectional diagram of a first region N in the array substrate of FIG. 3 along a BB' direction.

An embodiment of the disclosure provides an array substrate, as shown in FIG. 3 and FIG. 4, comprising a plurality of signal lines 40, a plurality of connecting lines 50 and a driving module 60 in a peripheral region outside a display region; each connecting line 50 is configured to connect at least one corresponding signal line 40 to the driving module 60 and transmit signals from the at least one corresponding signal line 40 to the driving module 60. Herein, as for a connecting line 50, the corresponding signal line 40 refers to a signal line designed to be electrically connected with the connecting line 50, and the non-corresponding signal line 40 refers to a signal line designed to be electrically insulated from the connecting line 50. Similarly, as for a signal line 40, the corresponding connecting line 50 thereof is a connecting line designed to be electrically connected with the signal line 40, and the non-corresponding connecting line 50 thereof refers to a connecting line designed to be electrically insulated from the signal line 40. The plurality of connecting lines 50 are located above the plurality of signal lines 40. An insulating layer 70 is arranged above the plurality of signal lines 40. The plurality of signal lines 40 are insulated from the plurality of connecting lines 50 via the insulating layer 70, and at least one connecting line 50 and at least one non-corresponding signal line 40 thereof intersect with each other. As shown in FIG. 3, in the plan view of the array substrate, the second electrode line layer 402 of at least one of the signal lines 40 is discontinuous at an intersection of the at least one of the signal lines 40 and at least one of the connecting lines 50. The at least one of the signal lines 40 is insulated from the at least one of the connecting lines 50, and the second electrode line layer 402 of at least one of the signal lines 40 is not overlapped with the at least one of the connecting lines 50 in a direction perpendicular to the array substrate. The second electrode line layer 402 is parallel with the first electrode line layer 401

Figure 5:
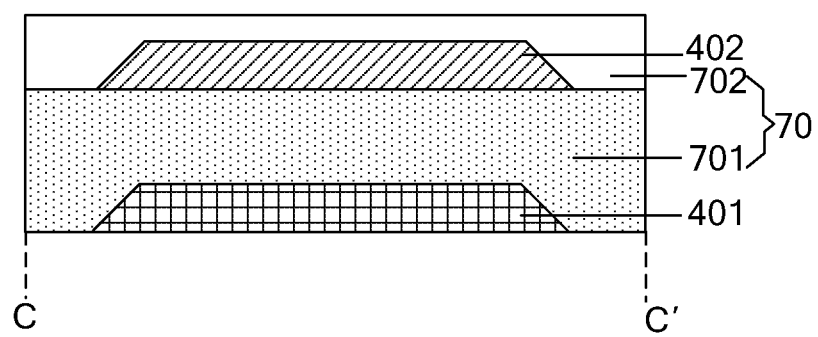
FIG. 5 is a cross-sectional diagram of a second region O in the array substrate of FIG. 3 along a CC' direction.

As shown in FIG. 4, in a first region N where the signal line 40 intersects with any non-corresponding connecting line 50, only a first electrode line layer 401 of the signal line and an insulating layer 70 are included. As shown in FIG. 5, in a second region O of the signal line other than the first region N, the first electrode line layer 401 and a second electrode line layer 402 of the signal line and the insulating layer 70 are included. The second electrode line layer 402, for example, is located above the first electrode line layer 401.

In the array substrate provided by the embodiment of the disclosure, the number of the signal lines 40 may be greater than the number of the connecting lines 50, or be equal to the number of the connecting lines 50, which is not limited by the embodiment of the disclosure, as long as one connecting line 40 is correspondingly connected with at least one signal line 50. Meanwhile, connecting modes between the connecting lines and the driving module are not limited by the embodiments of the disclosure, for example, it can be determined according to practical situation. In addition, materials for forming the connecting lines 50 are not limited by the embodiments of the disclosure, as long as electrical signals can be transmitted, for example, the connecting lines 50 are connecting lines made of metal.

In the array substrate provided by the embodiment of the disclosure, an insulating layer 70 is arranged above the signal line 40, wherein a thickness of the insulating layer 70 is not particularly limited, as long as a reliable insulation can be ensured between the connecting line and the signal line.

In the array substrate provided by the embodiment of the disclosure, the driving module 60 may be a gate driving circuit, or any other driving circuit, which is not particularly limited here. In addition, the signal line 40 may be a clock signal line, which is for providing clock signals to the driving module, or may be other signal lines, which are not particularly limited by the embodiment of the disclosure, and may be determined according to practical situation.

The embodiment of the disclosure provides an array substrate, in a peripheral region of the array substrate, the connecting lines are located above the signal lines, and at least one connecting line and at least one non-corresponding signal line intersect with each other. Only the first electrode line layer of the signal line and the insulating layer are included in the first region of the signal line intersecting with the non-corresponding signal line, and in addition of the first electrode line layer of the signal line and the insulating layer, the second electrode line layer of the signal line are further included in the second region of the signal line other than the first region. That is, the signal line does not include the second electrode line layer in the first region of the signal line intersecting with the non-corresponding connecting line, thus preventing problems of electrostatic accumulation or short circuit from occurring between the connecting line and the second electrode line layer; meanwhile, the insulating layer arranged above the first electrode line layer improves insulating properties between the connecting line and the signal line, and ensuring reliability of signal transmission.

Further, as shown in FIG. 4, in the first region N of the single line intersecting with the non-corresponding connecting line, a first insulating layer 701 and a second insulating layer 702 are arranged between the first electrode line layer 401 and the connecting line 50, so that the first insulating layer 701 and the second insulating layer 702 can function as two layers of insulating layers, which is conducive to enhancing insulating properties between the signal line and the connecting line. Thus significantly preventing problems of electrostatic accumulation or short circuit from occurring between the connecting line and the signal line. As shown in FIG. 5, in the second region O of the signal line other than the first region N described above, the first insulating layer 701, the second electrode line layer 402 and the second insulating layer 702 are sequentially arranged above the first electrode line layer 401, so that the second insulating layer 702 can play a insulating role to prevent the signal line from being interfered.

Further, as shown in FIG. 5, in the second region O of the signal line oilier than the first region N described above, the first insulating layer 701 is arranged between the first electrode line layer 401 and the second electrode line layer 402.

It should be noted that, signals transmitted by the first electrode line layer and the second electrode line layer may be the same or different, which is not limited by the embodiment of the disclosure. In an example, the first electrode line layer and the second electrode line layer are electrically connected, so as to transmit the same signals, thereby improving transmission speed of signals, and further reducing resistance of the signal line.

Figure 9:
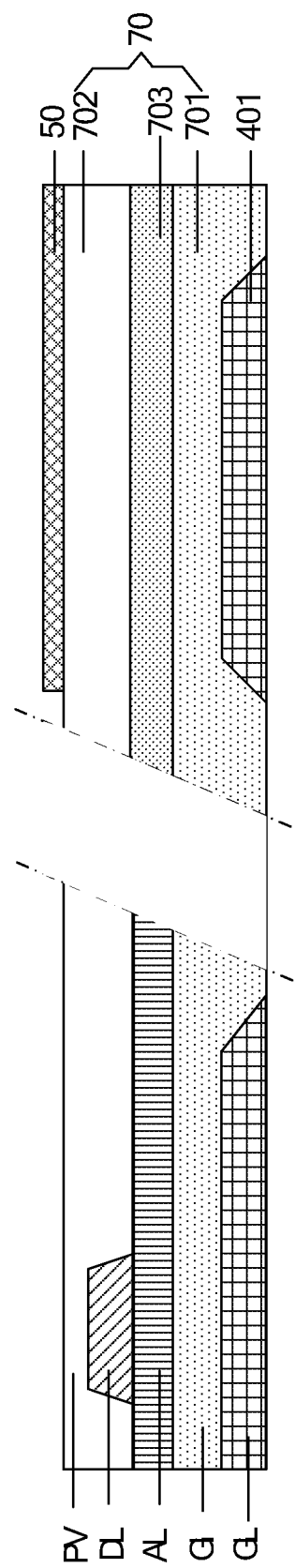
FIG. 9 is a cross-sectional diagram of an array substrate provided by an embodiment of the disclosure.

In a case where the first electrode line layer 401 and the second electrode line layer 402 transmit different signals, the first insulating layer 701 may make the first electrode line layer 401 and the second electrode line layer 402 be insulated from each other, thereby preventing mutual interference of signals transmitted by the first electrode line layer 401 and the second electrode line layer 402; in a case where the first electrode line layer 401 and the second electrode line layer 402 transmit the same signals, the first electrode line layer and the second electrode line layer can be electrically connected through a via hole V, as shown in FIG. 9.

In an example, the first electrode line layer 401 is electrically connected with the second electrode line layer 402, to transmit the same signals, thereby improving transmission speed of signals. For example, a via hole can be provided in the first insulating layer 701, and the first electrode line layer 401 and the second electrode line layer 402 can be connected electrically with each other through the via hole.

In an example, in order to improve insulating property between the first electrode line layer and the connecting line, in the first region of the signal line 40 intersecting with the non-corresponding connecting line 50, a sum of thicknesses of the first insulating layer 701 and the second insulating layer 702 is greater than or equal to 2000 Å.

Figure 6:
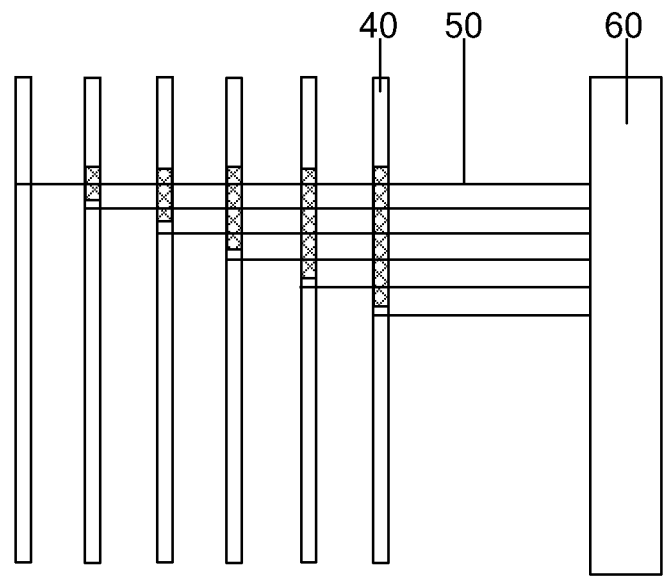
FIG. 6 is a partial planar structural schematic diagram of another array substrate provided by an embodiment of the disclosure.

Alternatively, in order to reduce difficulty in fabrication and simplify the processes, a plurality of connecting lines 50 can be distributed in at least one connecting region, and the signal lines 40 include the first electrode line layer but do not include the second electrode line layer in each connecting region. For example, a plurality of connecting regions can be evenly distributed on the array substrate. The number of connecting lines distributed in one connecting region is not limited here, for example, it may be determined according to the size of the display device including the array substrate. For example, it may be as shown in FIG. 3, three connecting lines define one connecting region; or it may be as shown in FIG. 6, six connecting lines define one connecting region.

Optionally, in order to reduce cost and save space, a width of the signal line is in a range of 10 to 25 μm, a distance between two adjacent signal lines is in a range of 10 to 25 μm, and a width of the connecting line is in a range of 4 to 8 μm.

Figure 7:
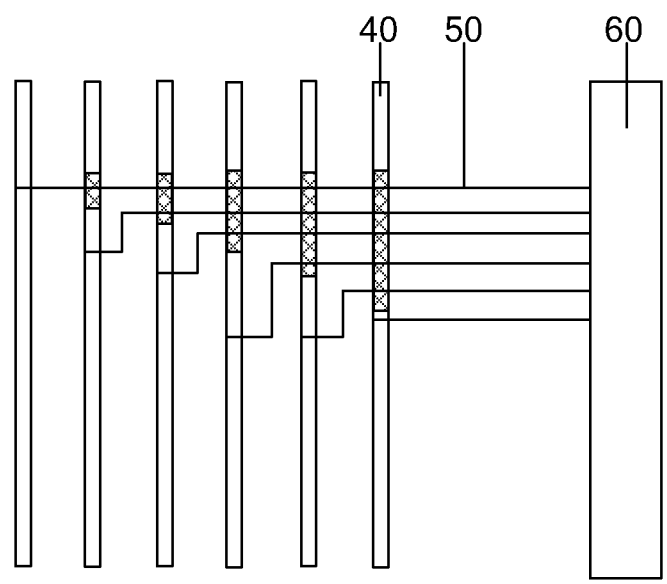
FIG. 7 is a partial planar structural schematic diagram of yet another array substrate provided by an embodiment of the disclosure.

Further, because the width of the connecting line 50 is in the range of 4 to 8 μm and the distance between two adjacent signal lines is in the range of 10 to 25 μm, referring to FIG. 7, a part of the connecting line 50 can be located between two adjacent signal lines 40, which can effectively utilize space resource between the two adjacent signal lines 40 and is conducive to connecting the signal line and the connecting line.

Optionally, the signal line 40 further includes an isolating layer 703 located between the first insulating layer 701 and the second insulating layer 702 in a region of the signal line 40 intersecting with the non-corresponding connecting line 50, as shown in FIG. 9, so that a thickness of the insulating layer between the signal line and the connecting line is further increased, thereby further improving insulating property between the signal line and the connecting line.

Optionally, the array substrate further comprises a display region, and the display region includes a plurality of gate lines and a plurality of data lines, wherein the gate lines and the data lines can receive signals through the driving module. For example, the driving module can be a GOA circuit for providing signals to the gate lines in the display region; and the driving module can also be a data line driving circuit providing signals to the data lines in the display region. In an example, the first electrode line layers 401 are formed simultaneously with the gate lines GL, and the second electrode line layers 402 are formed simultaneously with the data lines DL, as shown in FIG. 9. In this way, on the one hand, the display region, the driving module and the signal lines are integrated onto the array substrate, the driving module can provide signals to the gate lines or the data lines, so as to realize display; on the other hand, the first electrode line layers are formed simultaneously with the gate lines, and the second electrode line layers are formed simultaneously with the data lines, thus reducing the number of patterning processes, and reducing production cost. It should be noted that, that the first electrode line layers are formed simultaneously with the gate lines, for example, may refers to that the first electrode line layers and the gate lines are formed on the same layer and made of the same material through one patterning process including masking, exposing, developing, etching and stripping and the like; and that the second electrode line layers are formed simultaneously with the data lines, for example, may refer to that the second electrodes line layer and the data lines are formed on the same layer and made of the same material through one patterning process including masking, exposing, developing, etching and stripping and the like.

Figure 8:
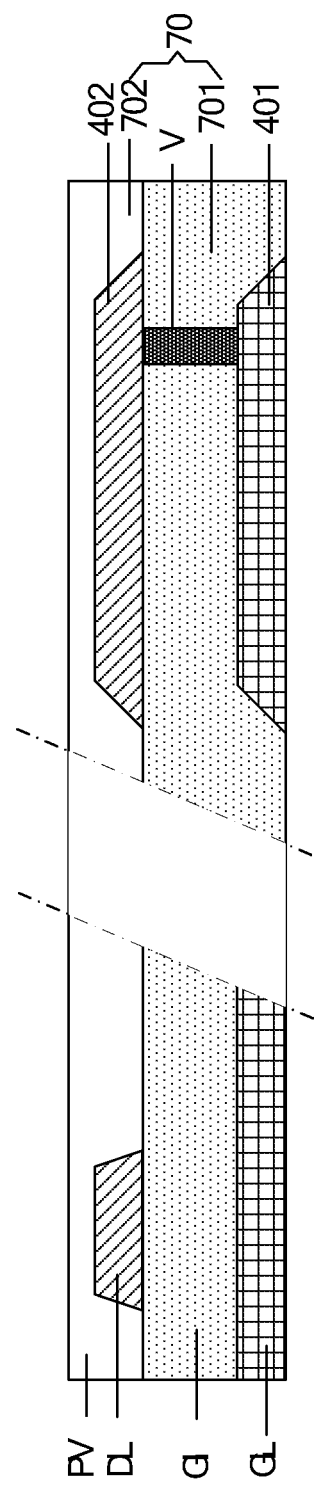
FIG. 8 is a cross-sectional diagram of an array substrate provided by an embodiment of the disclosure.

Further, the display region further includes a gate insulating layer GI located between the gate lines and the data lines, and a passivation layer PV covering the gate lines and the data lines, as shown in FIG. 8. The first insulating layer 701 is formed simultaneously with the gate insulating layer GI, and the second insulating layer 702 is formed simultaneously with the passivation layer PV, which can further reduce the number of patterning processes, thereby reducing production cost.

Further, the display region further includes an active layer AL located between the gate insulating layer GI and the data lines DL, as shown in FIG. 9, and the isolating layer is formed reduce the number of patterning processes the active layer. That in, for example, the isolating layer 703 and the active layer AL are formed on the same layer and have a same material through one patterning process including masking, exposing, developing, etching and stripping and the like, which can further reduce the number of patterning processes, thereby reducing production cost.

In an example, the first insulating layer 701 may have a thickness of 4000 Å, and the second insulating layer 702 may have a thickness of 2000 Å; and in the first region of the signal line 40 intersecting with a non-corresponding connecting line 50, the thickness of the insulating layer between the first electrode line layer 401 and the connecting line 50 is a sum of the thicknesses of the first insulating layer and the second insulating layer. Therefore, insulating property between the first electrode line layer 401 and the connecting line 50 is greatly enhanced, and problems of electrostatic accumulation or short circuit between the first electrode line layer 401 and the connecting line 50 can be avoided.

Figure 10:
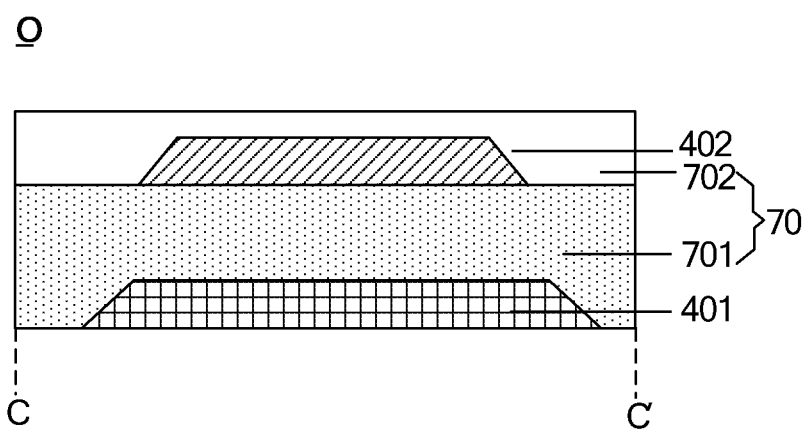
FIG. 10 is a cross-sectional diagram of an array substrate provided by an embodiment of the disclosure.

For example, as shown FIG. 10, in another example, the first electrode line layer 401 can be wider than the second electrode line layer 402 by 3 to 5 µm, so that difficulty in fabricating the second insulating layer later is reduced.

An embodiment of the disclosure provides a display device, comprising any array substrate described above. One example of the display device is a liquid crystal display device, wherein the array substrate is arranged opposite to a counter substrate to form a liquid crystal cell, and the liquid crystal cell is filled with liquid crystal material therein. The counter substrate is, for example, a color filter substrate. A pixel electrode of each pixel unit of the array substrate is used for exerting an electric field to control rotation degree of the liquid crystal material, so as to carry out a display operation. In some examples, the liquid crystal display further includes a backlight source for providing backlight to the array substrate. Another example of the display device is an organic electroluminescent display device, wherein the pixel electrode of each pixel unit of the array substrate functioning as a positive electrode or a negative electrode is used for driving organic electroluminescent material to emit light, so as to implement a display operation. The display device has advantages of narrow frame, longer service life and the like, and may be any product or component with a display function, such as a television, a digital camera, a mobile phone, a tablet computer and so on.

According to the above description, the embodiments according to the present disclosure at least can provide structures and methods as follows:

(1) An array substrate, comprising a plurality of signal lines, a plurality of connecting lines and a driving module in a peripheral region outside a display region, the connecting lines being configured for connecting the signal lines and the driving module, to transmit signal from the signal lines to the driving module, wherein, at least one of the connecting lines and at least one of the signal lines are designed to intersect with and insulated from each other in a first region, the at least one of the signal lines, in a second region other than the first region, includes a first electrode line layer and a second electrode line layer, while, in the first region, includes the first electrode line layer but does not include the second electrode line layer.

(2) The array substrate according to (1), wherein, in the second region, a first insulating layer, a second insulating layer, and the second electrode line layer located between the first insulating layer and the second insulating layer are arranged between the first electrode line layer and the connecting line; in the first region, the first insulating layer and the second insulating layer are arranged between the first electrode line layer and the connecting line.

(3) The array substrate according to (2), wherein, in the second region, the first insulating layer is arranged between the first electrode line layer and the second electrode line layer.

(4) The array substrate according to (2) or (3), wherein, a sum of thicknesses of the first insulating layer and the second insulating layer is greater than or equal to 2000 Å.

(5) The array substrate according to (3), wherein, the first electrode line layer is electrically connected with the second electrode line layer.

(6) The array substrate according to (5), wherein, a via hole is provided in the first insulating layer, and the first electrode line layer is electrically connected with the second electrode line through the via hole in the first insulating layer.

(7) The array substrate according to any one of (1) to (6), wherein, the plurality of connecting lines are distributed in one connecting region or a plurality of connecting regions.

(8) The array substrate according to (7), wherein, the plurality of connecting regions are evenly distributed.

(9) The array substrate according to any one of (1) to (8), wherein, a width of the signal line is in a range of 10 to 25 µm, a distance between two adjacent signal lines is in a range of 10 to 25 µm, and a width of the connecting line is in a range of 4 to 8 µm.

(10) The array substrate according to (9), wherein, a part of the connecting line is located between two adjacent signal lines.

(11) The array substrate according to claim 2, wherein, in the first region, the signal line further includes an isolating layer located between the first insulating layer and the second insulating layer.

(12) The array substrate according to any one of (1) to (11), wherein, the array substrate further comprises a plurality of gate lines and a plurality of data lines located in a display region; the first electrode line layer and the gate lines are formed on a same layer and made of a same material, and the second electrode line layer and the data lines are formed on a same layer and made of a same material.

(13) The array substrate according to (12), wherein, in the display region, a gate insulating layer located between the gate lines and the data lines, and a passivation layer covering the gate lines and the data lines are further included; the first insulating layer and the gate insulating layer are formed on a same layer and made of a same material, and the second insulating layer and the passivation layer are formed on a same layer and made of a same material.

(14) The array substrate according to (13), wherein, in the display region, an active layer located between the gate insulating layer and the data lines are further included; the isolating layer and the active layer are formed on a same layer and made of a same material.

(15) The array substrate according to (13), wherein, the first insulating layer has a thickness of 4000 Å, and the second insulating layer has a thickness of 2000 Å.

(16) The array substrate according to (12), wherein, the first electrode line layer is wider than the second electrode line layer by 3 to 5 µm.

(17) A display device, comprising the array substrate according to any one of (1) to (16).

Although the disclosure is described in detail hereinbefore with general illustration and embodiments, based on the disclosure, certain amendments or improvements can be made thereto, which is obvious for those skilled in the art. Therefore, the amendments or improvements made to the disclosure without departing from the spirit of the disclosure should be within the scope of the disclosure.

The present application claims priority of Chinese Patent Application No. 201510012613.1 filed on Jan. 9, 2015, the disclosure of which is incorporated herein by reference in its entirety as part of the present application.

The invention claimed is:

1. An array substrate, in a peripheral region outside a display region, comprising a plurality of signal lines, a plurality of connecting lines above the signal lines, and a driving module, the connecting lines being configured for connecting the signal lines and the driving module, to transmit signals from the signal lines to the driving module, wherein, each of the signal lines comprises a first electrode line layer and a second electrode line layer above the first electrode line layer, wherein, a first insulating layer is arranged between the first electrode line layer and the second electrode line layer, a second insulating layer is arranged above the second electrode line layer, wherein, at least one of the signal lines is insulated from and intersected with the at least one of the connecting lines in a plan view of the array substrate; the second electrode line layer of the at least one of the signal lines is discontinuous at an intersection of the at least one of the signal lines and the at least one of the connecting lines in the plan view of the array substrate; and the second electrode line layer of at least one of the signal lines is not overlapped with the at least one of the connecting lines in the plan view of the array substrate.

2. The array substrate according to claim 1, wherein, a sum of thicknesses of the first insulating layer and the second insulating layer is greater than or equal to 2000 Å.

3. The array substrate according to claim 1, wherein, the first electrode line layer is electrically connected with the second electrode line layer.

4. The array substrate according to claim 3, wherein, a via hole is provided in the first insulating layer, and the first electrode line layer is electrically connected with the second electrode line layer through the via hole in the first insulating layer.

5. The array substrate according to claim 1, wherein, a width of the signal line is in a range of 10 to 25 µm, a distance between two adjacent signal lines is in a range of 10 to 25 µm, and a width of the connecting line is in a range of 4 to 8 µm.

6. The array substrate according to claim 5, wherein, in a plan view of the array substrate, a part of the connecting line between two adjacent signal lines extends in a direction of the signal line.

7. The array substrate according to claim 1, wherein, an isolating layer is located between the first insulating layer and the second insulating layer.

8. The array substrate according to claim 1, wherein, the array substrate further comprises a plurality of gate lines and a plurality of data lines located in a display region; the first electrode line layer and the gate lines are located on a same layer and made of a same material, and the second electrode line layer and the data lines are located on a same layer and made of a same material.

9. The array substrate according to claim 8, wherein, in the display region, a gate insulating layer located between the gate lines and the data lines, and a passivation layer covering the gate lines and the data lines are further included; the first insulating layer and the gate insulating layer are located on a same layer and made of a same material, and the second insulating layer and the passivation layer are located on a same layer and made of a same material.

10. The array substrate according to claim 9, wherein, in the display region, an active layer located between the gate insulating layer and the data lines are further included; the isolating layer and the active layer are located on a same layer.

11. The array substrate according to claim 9, wherein, the first insulating layer has a thickness of 4000 Å, and the second insulating layer has a thickness of 2000 Å.

12. The array substrate according to claim 8, wherein, the first electrode line layer is wider than the second electrode line layer by 3 to 5 µm.

13. A display device, comprising the array substrate according to claim 1.

14. The array substrate according to claim 1, wherein, in the plan view of the array substrate, the at least one of the signal lines comprises a first portion and a second portion apart from and adjacent to each other, at least two of the connecting lines are between the first portion and the second portion of the second electrode line layer of at least one of the signal lines.

15. The array substrate according to claim 1, wherein, the second electrode line layer of the at least one of the signal lines are disconnected at a plurality of positions, the positions are evenly distributed.

16. The array substrate according to claim 1, wherein, the plurality of signal lines are clock signal lines, the connecting lines are configured to transmit clock signals from the clock signal lines to the driving module.

17. The array substrate according to claim 1, wherein, in each of the signal lines, the first electrode line layer and the second electrode line layer are identical in width in the plan view of the array substrate.

* * * * *